United States Patent
Barth et al.

(10) Patent No.: US 7,034,400 B2
(45) Date of Patent: Apr. 25, 2006

(54) DUAL DAMASCENE INTERCONNECT STRUCTURE USING LOW STRESS FLUOROSILICATE INSULATOR WITH COPPER CONDUCTORS

(75) Inventors: Edward P. Barth, Ridgefield, CT (US); Glenn A. Biery, Steetsburg, NY (US); Jeffrey P. Gambino, Westford, VT (US); Thomas H. Ivers, Hopewel Jct, NY (US); Hyun K. Lee, LaGrangeville, NY (US); Ernest N. Levine, Poughkeepsie, NY (US); Ann McDonald, New Windsor, NY (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/659,778

(22) Filed: Sep. 10, 2003

(65) Prior Publication Data

US 2004/0061235 A1   Apr. 1, 2004

Related U.S. Application Data

(63) Continuation of application No. 09/467,207, filed on Dec. 20, 1999, now abandoned, which is a continuation-in-part of application No. 08/744,846, filed on Nov. 8, 1996, now Pat. No. 6,310,300.

(51) Int. Cl.
H01L 23/48 (2006.01)
(52) U.S. Cl. ............ 257/760; 257/758; 438/624; 438/637; 438/666
(58) Field of Classification Search ......... 438/624, 438/637, 666; 257/760, 758
See application file for complete search history.

(56) References Cited

U.S. PATENT DOCUMENTS

| | | | |
|---|---|---|---|
| 3,620,833 A | 11/1971 | Gleim et al. | |
| 4,300,989 A | 11/1981 | Chang | |
| 5,011,732 A | 4/1991 | Takeuchi et al. | |
| 5,181,985 A | 1/1993 | Lampert et al. | |
| 5,219,791 A | 6/1993 | Freiberger | |
| 5,306,671 A | 4/1994 | Ogawa et al. | |
| 5,378,317 A | 1/1995 | Kashiwase et al. | |
| 5,380,397 A | 1/1995 | Fukuyama et al. | |
| 5,384,281 A | 1/1995 | Kenney et al. | |
| 5,397,748 A | 3/1995 | Watanabe et al. | |
| 5,423,945 A | 6/1995 | Marks et al. | |
| 5,429,995 A * | 7/1995 | Nishiyama et al. | 438/788 |
| 5,451,543 A | 9/1995 | Woo et al. | |
| 5,466,638 A | 11/1995 | Eguchi | |
| 5,497,545 A | 3/1996 | Watanabe et al. | |
| 5,527,718 A | 6/1996 | Seita et al. | |
| 5,644,166 A | 7/1997 | Honeycutt et al. | |

(Continued)

FOREIGN PATENT DOCUMENTS

JP     07094606 A2     7/1995

(Continued)

OTHER PUBLICATIONS

S. M. Sze, VLSI Technology, second edition, p233-234, 266-267, 1988.

(Continued)

*Primary Examiner*—Amir Zarabian
*Assistant Examiner*—Christy Novacek
(74) *Attorney, Agent, or Firm*—Lisa U. Jaklitsch

(57) ABSTRACT

A metallization insulating structure, having
a substrate;
a substantially fluorine free insulating layer formed on the substrate, having a height, $h_i$;
a fluorine containing insulating layer formed on the substantially fluorine free insulating layer, having a height $h_f$.

12 Claims, 2 Drawing Sheets

U.S. PATENT DOCUMENTS

| | | | |
|---|---|---|---|
| 5,661,334 A | | 8/1997 | Akram |
| 5,753,564 A | | 5/1998 | Fukada |
| 5,821,175 A | | 10/1998 | Engelsberg |
| 5,930,655 A | | 7/1999 | Cooney, III et al. |
| 5,976,972 A | * | 11/1999 | Inohara et al. ............... 438/640 |
| 6,004,883 A | | 12/1999 | Yu et al. |
| 6,040,243 A | | 3/2000 | Li et al. |
| 6,066,577 A | | 5/2000 | Cooney, III et al. |
| 6,214,730 B1 | | 4/2001 | Cooney, III et al. |
| 6,307,265 B1 | * | 10/2001 | Anand et al. ................ 257/758 |
| 6,310,300 B1 | | 10/2001 | Cooney, III et al. |
| 6,326,301 B1 | * | 12/2001 | Venkatesan et al. ......... 438/638 |
| 6,333,257 B1 | | 12/2001 | Aoi |
| 6,420,261 B1 | * | 7/2002 | Kudo .......................... 438/633 |

FOREIGN PATENT DOCUMENTS

KR    94-12488    6/1999

OTHER PUBLICATIONS

1990 Proceedings, Seventh International IEEE VLSI Multilevel Interconnection Conference, C.M. Dalton, p. 289-95, Jan. 1990.

* cited by examiner

DUAL DAMASCENE INTERCONNECT STRUCTURE USING LOW STRESS FLUOROSILICATE INSULATOR WITH COPPER CONDUCTORS

CROSS-REFERENCE TO RELATED APPLICATIONS

This invention is a continuation of U.S. patent application Ser. No. 09/467,207, entitled "Dual Damascene Interconnect Structure Using Low Stress Fluorosilicate Insulator With Copper Conductors," filed Dec. 20, 1999now abandoned, which is a continuation-in-part of U.S. patent application Ser. No. 08/744,846, filed Nov. 8, 1996 entitled "Fluorine-Free Barrier Layer Between Conductor and Insulator for Degradation Prevention," now U.S. Pat. No. 6,310,300, both of which are assigned to the same assignee. The specification of U.S. patent application Ser. No. 09/467,207 and U.S. Pat. No. 6,310,300 are each incorporated herein in its entirety.

BACKGROUND OF THE INVENTION

1. Field of the Invention

The present invention generally relates to semiconductor devices and manufacturing and, more particularly, to methods and structures which prevent degradation in semiconductor device wiring.

2. Background Description

Degradation can occur in metal lines in contact with insulator materials containing fluorine. This degradation is a serious concern because it represents a potential failure mechanism for an integrated circuit, IC. The degradation problem is costly to the industry by virtue of the process monitoring, inspections, and equipment maintenance requirements that it entails.

The performance of advanced semiconductor devices is becoming increasingly limited by the delays in the back-end-of-line (BEOL) interconnections. These delays are dependent on both the resistance and capacitance of the wiring structures, which are partially determined by the material properties (resistivity and dielectric constant) of the conductors and insulators used. Copper is being used as the conductor for several emerging technology generations to address at least the issue of resistivity. Copper metallurgy formation is possible using a dual damascene integration scheme. In an ongoing effort to lower overall capacitance wherever possible, several low dielectric constant insulators are being investigated for reducing BEOL capacitance. One leading candidate is fluorosilicate glass (FSG) which can reduce the insulator dielectric constant while maintaining many advantages of inorganic, plasma-enhanced CVD films.

Dual damascene wiring consists of wiring trenches and vertical vias between the trenches, which are filled with copper. Typically the copper in the trenches and vias is cladded with a thin layer of refractory metal or metal nitrides containing Ta, Ti, or W. There are a number of specific challenges in using FSG insulators with dual-damascene copper integration. Chiefly, the compatibility of commonly used metallization schemes (liners, diffusion barriers, seed layers, etc) with free fluorine species is of concern. Additionally, the reliability of damascene interconnects is generally thought to be sensitive to the stresses imposed by the insulators and other layers necessary when forming conducting lines and vias. It is recognized that fluorine stability of FSG materials can be increased by careful control of deposition variables. For some FSG films which are otherwise suitable for integration with copper dual damascene interconnections, this stability is inversely related to the mechanical stresses in the FSG insulator films. This relationship, along with the contamination susceptibility of copper interconnections to fluorine species, poses particular difficulties for this integration.

For example, undoped PECVD silane oxide has a relative dielectric constant of 4.3. As $SiF_4$ doping is added to the plasma, the resulting fluorine incorporation into the film decreases the dielectric constant. The fluorine content in the film is typically quantified by FTIR measurement of the Si—F:SiO bond ratio. Film stress correlates with the fluorine content. Table 1 exemplifies the relationship between fluorine content, dielectric constant and stress of some FSG films. Based on reliability data collected on standard homogeneous FSG films (i.e. single layer) integrated into dual damascene copper wiring, we have determined that films with Si—F:Si—O bond ratios above 1.2% can attack the interface between the via and the underlying copper wire resulting in increased via resistance and via opens. Although decreasing the Si—F:Si—O ratio to less than 0.6% eliminates the via interface problem, the high stress of the low fluorine-content FSG film causes significant manufacturing and reliability problems with the resulting structures.

TABLE 1

Dielectric constant and film stress as a function of fluorine content (Si—F:Si—O bond ratio) for FSG films.

| Si—F:SiO | k | stress |
| --- | --- | --- |
| 0 | 4.1 | $-1.0E^9$ dynes/cm$^2$ |
| <0.5% | 4.1 | $-1.8E^9$ |
| 0.6% | 3.8 | $-1.2E^9$ |
| 1.2% | 3.8 | $-1.1E^9$ |
| 1.9% | 3.7 | $-1.0E^9$ |
| 2.2% | 3.6 | $-0.9E^9$ |
| 2.5% | 3.6 | $-0.9E^9$ |

SUMMARY OF THE INVENTION

It is therefore an object of the present invention to provide degradation resistance for metals in contact with fluorine-containing insulator materials.

It is another objective of this invention to minimize fluorine poisoning of metals used in IC metallization schemes to reduce undesired via resistance growth and to enhance the contact between a metallization layer and the metal in a via plug.

These and other objectives are achieved in the present invention by providing a metallization insulating structure, comprising:

a substrate;

a substantially fluorine free insulating layer formed on the substrate, having a height, $h_i$;

a fluorine containing insulating layer formed on the substantially fluorine free insulating layer, having a height, $h_f$.

DESCRIPTION OF THE PREFERRED EMBODIMENTS

Figure 1:
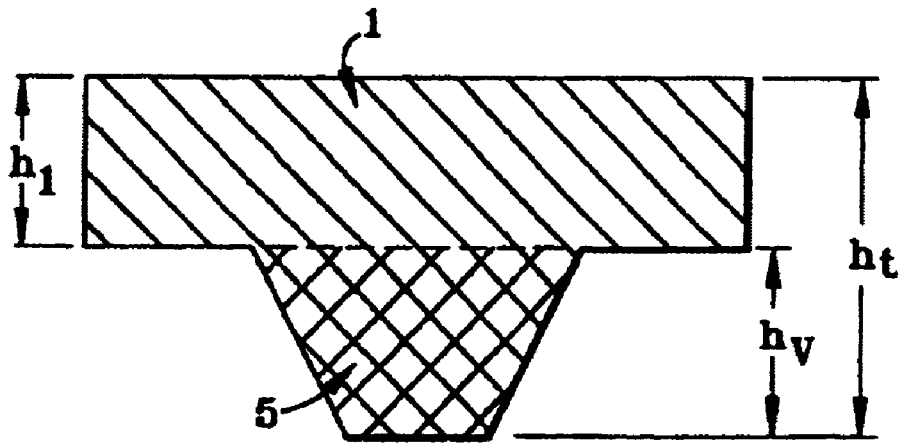
FIG. 1 is a cross sectional view of a typical line/via configuration

For purposes of the present invention, the terminology "degradation", can mean two things. First as used in connection with metal contact and metal-based conductors of electricity, degradation encompasses "corrosion" or "poisoning" of a metal. "Corrosion" of a metal line or metal contact by exposure to fluorine means formation of a metal fluoride compound from fluorine and the metal via chemical reaction. "Poisoning" of a metal by exposure to fluorine means physical infiltration of the metal by fluorine as a contaminant in an amount adequate to increase the contact resistance of the contaminated metal interfaces. Second, degradation is the negative effect on the reliability or electrical properties of the interconnection, due either to the chemical or physical influence of a species.

While not desiring to be bound to any particular theory, it is thought that fluorine-containing insulating materials tend to release fluorine constituents during patterning of metal lines and metal conductors, particularly in the form of fluorine (F) or fluorine gas ($F_2$), which initiates and/or promotes the corrosion and/or poisoning of metals, such as aluminum, copper, tantalum, or titanium, that become exposed to and infiltrated by the released fluorine. This phenomenon has been observed to occur whether the fluorine is an intentional component of the insulator material or even an inadvertent contaminant thereof. For instance, fluorine has been found by the present investigators to be a contaminant in commonly-used TEOS (i.e., tetraethylorthosilicate) based insulator films which are commonly-used as insulating films between metal conductor lines. The presence of fluorine as a contaminant in the insulator layer nonetheless poses a potential degradation threat, once released, to adjacent metal conductor lines.

It has been observed by the investigators of this invention that the rate of corrosion experienced in metal exposed to fluorine is positively related to the concentration of fluorine in the adjoining insulator film; that is, a lower-concentration of fluorine in the insulator film causes less metal corrosion than the case where higher concentrations of fluorine are present in the insulator film.

In general, the thickness of the fluorine-free barrier layer will partially depend on the barrier material and its particular morphology. The thickness of the fluorine-free barrier layer will also be based on the depth of the conducting line that will be formed later. In an embodiment of this invention, the fluorine-free barrier layer is especially useful in a situation where insulator films are intentionally doped with fluorine for the purpose of reducing the dielectric constant of the insulator films in order to reduce capacitive coupling between adjacent metal lines.

This invention relates to a structure with a two component dual damascene dielectric for copper wiring consisting of low stress $SiO_2$ (USG), and low stress $SiO_xF_y$ (FSG). In this structure, the lower and middle portions of the vias are surrounded by USG; the upper portion of the vias are surrounded by either FSG or USG; and the wiring trenches are surrounded by an FSG insulator. Note the interface between the USG and FSG insulators need not correspond with the intersection of the vias and lines, but could be tailored for optimal performance, manufacturability and reliability. Typically the overall height of the FSG insulator would be greater than the height of the interconnection lines, while still maintaining a fraction of the via height surrounded by USG. Finally note that a layer of silicon nitride or other etch stops could be included between the USG and FSG dielectrics or at the bottom of the wire trench, to allow for a selective trench RIE process and more controlled trench depth.

Figure 2:
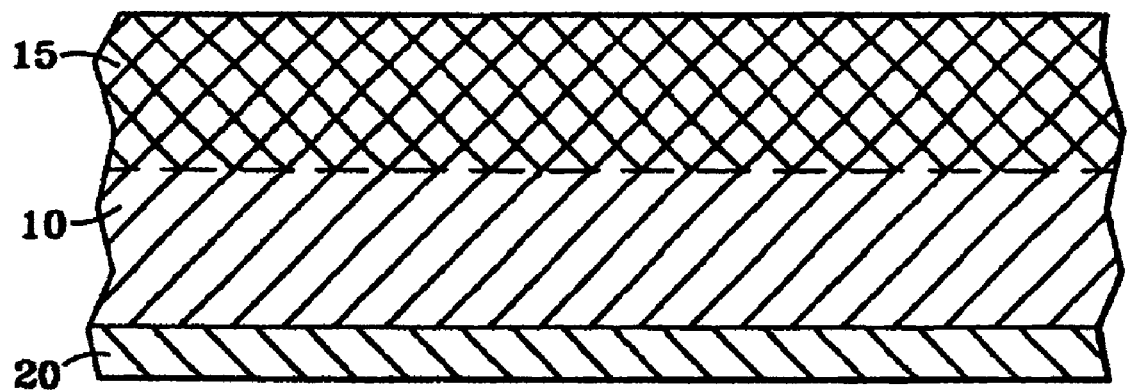
FIG. 2 is a cross sectional view of an embodiment of the structure of the instant invention.

Referring to the figures generally and FIG. 1 specifically, there is shown a representation of a typical line/via structure. The line portion, 1, has a height represented by $h_l$, and the via portion, 5, has a height represented by $h_v$. The overall height of the structure, $h_t$ equals $h_{v+hl}$. When forming the structure of the instant invention, as shown in FIG. 2, a layer of a first undoped insulator, 10, is deposited according to any means known in the art. The height of the undoped layer should not be equal to $h_l$. A substantial portion of the beneficial effects of the structure as outlined in this invention are not achieved when the height of the undoped layer is sign greater than height of the via, $h_v$. It is preferable if the height of the undoped material is significantly less than the height of the via, $h_v$. A second insulating layer of a doped insulating material, 15, is then deposited. The height of the doped layer should be equal to $h_t-h_v$. One of the objectives of the instant invention is to balance mechanical stress needs with increased interconnect capacitance. The balance of those two should be kept in mind when choosing the thicknesses of the doped and undoped materials. Also in a preferred embodiment, a layer of capping layer, 20, would be deposited prior to the deposition of the undoped first insulating layer. The maximum via height, $h_v$ should then greater than —the height of the undoped insulating material plus the capping layer material.

The undoped insulating material can be selected from any material known in the art. Preferably, the undoped insulating material would be any silicon dioxide based film which is compatible with back end of the line (BEOL) processing and does not contain any significant fluorine content, whether intentional or unintentional. More preferably, the undoped insulating material would be undoped silica glass (USG). Most preferably, the undoped material would be plasma enhanced chemical vapor deposited (PEG VD) silica glass from silane or tetraethylorthosilicate (TEOS) precursors. The doped insulating material can be selected from any material where the use of the material causes capacitance/ stress tradeoffs. In a preferred embodiment, the final structure should have a mean compressive stress (as- deposited) of between $0.8E^9$ and $1.4E^9$ dynes/$cm^2$. Preferably, the doping would be fluorine. The fluorinated insulators could be any insulator with sufficient fluorine content to have a risk of degradation when integrated with metallization susceptible to fluorine poisoning- The fluorinated insulating material could be any of the following, including but not limited to, fluorinated silicon dioxide, fluorinated amorphous or diamondlike carbon or fluorinated organic polymers. Preferably, the doped insulating material would be fluorinated silica glass (FSG). The capping material could be any material with suitable etch selectivity relative to the chosen undoped insulator, appropriate copper diffusion barrier properties and other properties compatible with BEOL processes. An example of preferred embodiment capping layer materials include, but are not limited to silicon nitride, silicon carbide or hydrogenated silicon carbide. Preferably, the capping layer would comprise silicon nitride $Si_xN_y$.

Each of the three layers could be deposited by any means known in the art. Examples of deposition methods for depositing the undoped layer include any PECVD or HDP-CVD processed silica film, for example from $SiH_4$ or tetraethylorthosilicate (TEOS) precursors, provided that the average stress of the bilayer stack is as described above. The FSG film would similarly preferably be either PECVD or HDP-CVD, using either SiH$_4$ or TEOS precursors and using any of a numerous fluorine sources, including SiF$_4$ or C$_2$F$_6$. The dielectric constant of the FSG film can range from about 3.5 to about 3.9. An example of the method leading to the final structure of the instant invention is given in Example I.

EXAMPLE I

In the instant invention(we are presupposing that h$_v$=0.6μm) and h$_f$=0.4 μm. An underlying wire 40, in an underlying wiring level, 45 is capped with 700A of silicon nitride. A 0.4μm layer of undoped silica glass (USG) is then deposited. A layer of doped silica glass, FSG, 0.53μm, is then deposited. The FSG film which is used is a dual frequency PECVD film, deposited from SiH$_4$, N$_2$O inert carrier gases and SIF$_4$ as the fluorine doping gas. The deposition is at 380–400C., with 2000W of total RF power. The dielectric constant of the film is about 3.75, the refractive index is about 1.445 and the as deposited stress of the film is about 1.5E$^9$/ dynes/cm$_2$ in the compressive direction. The USG film is a single frequency PECVD film, deposited from SiH$_4$, N$_2$O) and inert carrier gases. The deposition is at 380–400C., with 1100W of total power. The dielectric constant is about 4.1, the refractive index is about 1.46 and the stress is about 0.8E$_9$ in the compressive direction.

Figure 3:
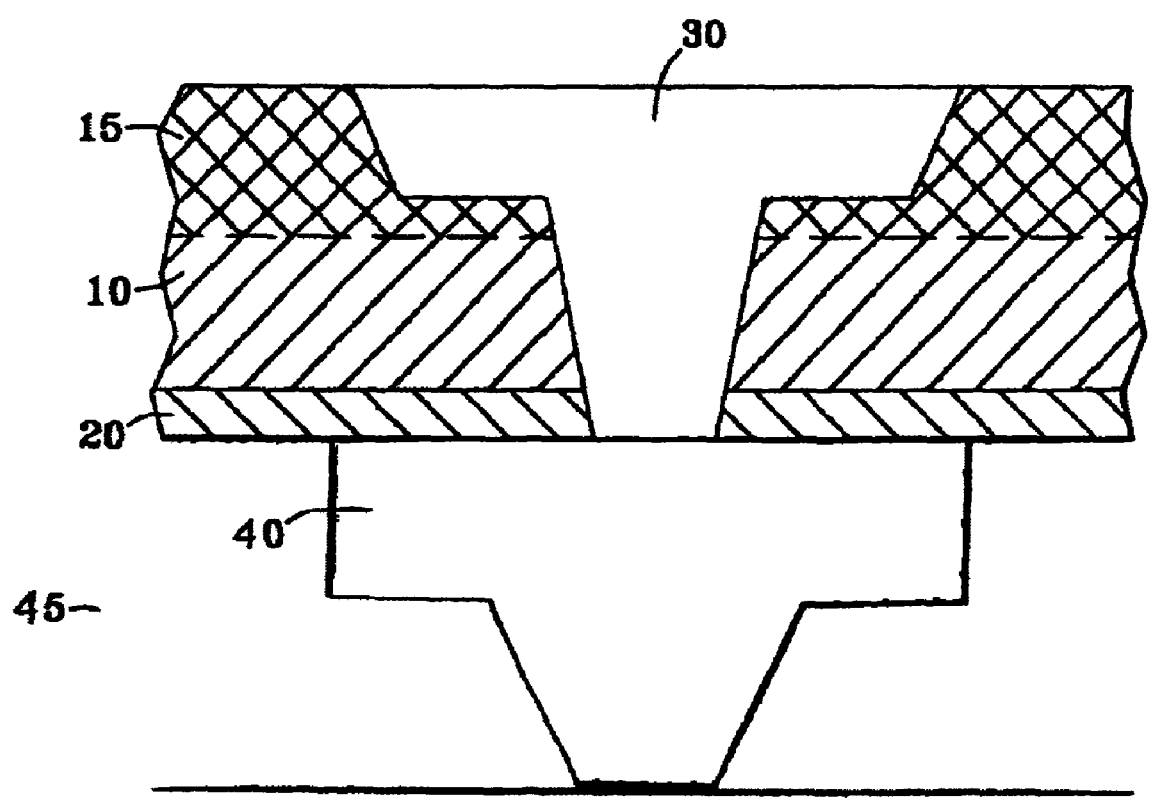
FIG. 3 is a cross sectional view of an embodiment of the structure of the instant invention.

After forming the two, or three layers metallization can occur. The metallization can be formed, or patterned, using any process known in the art but preferably, a dual damascene process would follow. It should be noted that the instant invention is independent of the metallization deposition process. When a dual damascene formation process is used either a line first or a via first approach is possible. A representation of the insulation barrier layers with the metallization is shown in FIG. 3, where the capping layer, 20, is silicon nitride, the undoped layer, 10, is USG, the doped layer, 15, is FSG and the metallization, 30, is copper.

While the invention has been described in terms of its preferred embodiments, those skilled in the art will recognize that the invention can be practiced with modification within the spirit and scope of the appended claims.

The invention claimed is:

1. A metallization insulating structure, comprising:
   a substantially planar substrate having wires therein;
   a first layer, the first layer a substantially fluorine free insulating layer formed on the substrate, having a height hi;
   a second layer, the second layer a fluorine containing insulating layer formed directly on the first layer, having a height hf, an interface between said first and second layer being substantially planar; and,
   a metal structure of at least height hi+hf formed in the first and second layer, the metal structure extending to the substrate, the metal structure comprising a line and a via, a bottom of the line and an upper portion of the via contacted by the second layer, the line having a height hl less than the overall height of the second layer hf.

2. The structure of claim 1, the via having a height hv greater than the height of the first layer hi.

3. The structure of claim 2, the metal structure having a height ht equivalent to height of the line hi plus the height of the via hv.

4. The structure of claim 3, wherein the height of the first layer hi is substantially less than the height of the via hv.

5. The metallization insulating structure according to claim 1 wherein the fluorine containing insulating layer comprises a material selected from the group consisting of fluorinated silicon oxide, fluorinated amorphous carbon, fluorinated diamondlike carbon and fluorinated organic polymers.

6. The metallization insulating structure according to claim 1 wherein the substantially fluorine free insulating layer comprises undoped silicon glass.

7. The structure of claim 1, a middle portion of the via contacted by the first layer.

8. The structure of claim 7, a lower portion of the via contacted by one of the first layer and a capping layer.

9. The metallization insulating structure of claim 1 further comprising a capping layer on the substrate, underlying the first layer.

10. The metallization insulating structure according to claim 9 wherein the capping layer comprises a material selected from the group consisting of silicon nitride, silicon carbide and hydrogenated silicon carbide, or combinations thereof.

11. The metallization structure of claim 9, wherein the metal structure extends through the capping layer such that the height of the structure is greater than hi+hf.

12. The structure of claim 9 wherein the metal structure is in contact with the underlying wires through the capping layer.

* * * * *